United States Patent [19]
Molyneaux et al.

[11] Patent Number: 5,578,925
[45] Date of Patent: Nov. 26, 1996

[54] VERTICAL FIELD QUADRATURE PHASED ARRAY COIL SYSTEM

[75] Inventors: David A. Molyneaux, Mentor; William O. Braum, Solon, both of Ohio

[73] Assignee: Picker International, Inc., Highland Heights, Ohio

[21] Appl. No.: 512,274

[22] Filed: Aug. 18, 1995

[51] Int. Cl.$^6$ .................................................... G01V 3/00
[52] U.S. Cl. ............................................. 324/318; 324/322
[58] Field of Search .................................... 324/318, 322, 324/307, 309; 128/653.5

[56] References Cited

U.S. PATENT DOCUMENTS

| | | | |
|---|---|---|---|
| 4,721,913 | 1/1988 | Hyde et al. | 324/318 |
| 4,825,162 | 4/1989 | Roemer et al. | 324/318 |
| 5,153,517 | 10/1992 | Oppelt et al. | 324/322 |
| 5,198,768 | 3/1993 | Keren | 324/318 |
| 5,256,971 | 10/1993 | Boskamp | 324/318 |
| 5,315,251 | 5/1994 | Derby | 324/318 |
| 5,394,087 | 2/1995 | Molyneaux | 324/318 |

OTHER PUBLICATIONS

"The NMR Phased Array", Roemer, et al., Academic Press, Inc. 1990 Magnetic Resonance in Medicine 16, 192–225 (1990).
"Weighting Functions for Combination of NMR Images Obtained with Multiple Surface Coils", Reykowski, et al., p. 519 SMRM Aug. 1990, 9th Ann. Meeting.
"Modification of an MR Receiver for Simultaneous Image Acquisition From Two Channels", Wright, p. 533 SMRM Aug. 1989 8th Ann Meeting.
"Improvement of SNR at Low Field Strength Using Mutually Decoupled Coils For Simultaneous NMR Imaging", Leussler, et al., p. 724 SMRM Aug. 1990 9th Annual Meeting.
"Volume Imaging with MR Phased Arrays", Hayes, et al. p. 175 SMRM Aug. 1989 8th Annual Meeting.

*Primary Examiner*—Louis M. Arana
*Attorney, Agent, or Firm*—Fay, Sharpe, Beall, Fagan, Minnich & McKee

[57] ABSTRACT

A vertical $B_0$ temporally constant magnetic field is defined between a pair of pole faces (12, 14) that are interconnected by a C-shaped ferrous magnetic flux path (16). A quadrature radio frequency coil array (50) is disposed in a plane orthogonal to the $B_0$ field. The coil array includes a plurality of coils ($50_1$, $50_2$, ... ) that are disposed in a partially overlapping relationship. Each of the coils has a peripheral loop (60), preferably defined by four linear legs ($60_1$, $60_2$, $60_3$, $60_4$) of equal length which define a square. A pair of crossing elements ($62_1$, $62_2$) are connected with mid-points of opposite sides of the square, the opposite mid-points are 180° out-of-phase with each other at the magnetic resonance frequency and 90° out-of-phase with neighboring mid-points of the square. The crossing elements cross but are not connected, in a symmetric relationship. Each of the crossing elements has a radio frequency pick-up ($64_1$, $64_2$) associated therewith. The two radio frequency pick-ups receive 90° offset, quadrature radio frequency signals from resonating nuclei within the $B_0$ field.

19 Claims, 8 Drawing Sheets

VERTICAL FIELD QUADRATURE PHASED ARRAY COIL SYSTEM

BACKGROUND OF THE INVENTION

The present invention relates to the magnetic resonance arts. It finds particular application in conjunction with magnetic resonance imaging of the spine in permanent C-magnet magnetic resonance imaging systems and will be described with particular reference thereto. However, it is to be appreciated that the present application will also find application in conjunction with other magnetic resonance imaging and spectroscopy systems in which the $B_0$ primary magnetic field is orthogonal to the plane of the radio frequency coils.

Conventionally, magnetic resonance imaging procedures include disposing the patient in a substantially uniform, primary magnetic field $B_0$. Magnetic resonance is excited in dipoles which preferentially align with the $B_0$ field by transmitting radio frequency excitation signals into the examination region and receiving radio frequency magnetic resonance signals emanating from the resonating dipoles.

Most commonly, the $B_0$ field is generated along the central bore of an annular magnet assembly, i.e., the $B_0$ field aligns with the central axis of the patient. Cylindrical radio frequency and gradient magnetic field coils surround the bore. In order to improve the signal-to-noise ratio, quadrature surface coils have been utilized to examine a region of interest in quadrature, i.e., to receive signal components that are perpendicular to the coil and components that are parallel to the coil. See, for example, U.S. Pat. No. 4,918,388 of Mehdizadeh, which illustrates a loop coil and a flat Helmholtz coil, both of which receive resonance signals from the same region. The loop and flat Helmholtz coils are sensitive to orthogonal components of the magnetic resonance signal emanating from dipoles that are aligned with the horizontal magnetic field. When the output of one of the loop and flat Helmholtz coils is shifted by 90° and the two signals are combined, the signal-to-noise ratio is improved by about $\sqrt{2}$.

In order to examine larger regions of patients disposed in the bore of a horizontal $B_0$ field imager, surface coils consisting of a plurality of loop coils have also been used. See, for example U.S. Pat. No. 4,825,162 of Roemer and Edelstein. More specifically, a series of loop coils are partially overlapped in order to examine contiguous regions. As explained mathematically by Grover in "Inductance Calculations" (1946) and summarized in the Roemer and Edelstein patent, the mutual inductance between adjacent coils is minimized when the coils are positioned by a slight overlap. Although the use of overlapped loop coils with the induction minimized enabled a larger area to be examined, each coil was linear. That is, each coil was sensitive to only one component and not sensitive to the orthogonal component such that no quadrature detection was provided.

U.S. Pat. No. 4,721,913 of Hyde, et al. illustrates another surface coil technique for horizontal field magnets. A series of linear coils are arranged continuous to each other, but with each coil disposed 90° out-of-phase with adjacent coils. Thus, each coil received a radio frequency magnetic resonance signal component that was orthogonal to its neighbors.

In U.S. Pat. No. 5,394,087 of Molyneaux, a loop and flat Helmholtz coil are superimposed to provide a flat quadrature coil. A plurality of these flat quadrature coils are partially overlapped to define a planar, quadrature coil array.

While the above-referenced surface coils are effective for horizontal $B_0$ field magnetic resonance imaging equipment, all magnetic resonance imaging equipment does not employ a horizontal $B_0$ field. C-magnet magnetic resonance imagers include a pair of parallel disposed pole pieces which are interconnected by a C or U-shaped iron element. The iron element may be a permanent magnet or can be electrically stimulated by encircling coils to a magnetic condition. Typically, the pole pieces are positioned horizontally such that a vertical field is created in between. Thus, in an annular bore magnetic field imager, the $B_0$ field extends between the patient's head and feet (or feet and head); whereas, in a C-shaped magnet the $B_0$ magnetic field extends between a patient's back and front (or front and back). Due to the 90° rotation of the $B_0$ field, quadrature surface coils such as illustrated in the above-referenced U.S. Pat. No. 5,394,087, when positioned along the patient's spine in a vertical $B_0$ field magnetic resonance imager, would not function in quadrature. They would loose sensitivity to one of their modes.

The present invention provides a new and improved radio frequency coil that provides quadrature reception/transmission in vertical $B_0$ field magnets.

SUMMARY OF THE INVENTION

In accordance with one aspect of the present invention, a magnetic resonance imaging system is provided. A vertical, temporally constant $B_0$ magnetic field is defined between a pair of generally horizontal magnet pole pieces. A generally C-shaped ferrous flux path connects the pole pieces. Gradient magnetic field coils are disposed adjacent the pole pieces for causing gradient magnetic fields across the temporally constant $B_0$ magnetic field. A means is provided for exciting resonance in selected dipoles in between the pole faces such that the dipoles generate resonance signals at a characteristic resonance frequency. A radio frequency coil assembly receives the resonance signals from the resonating dipoles. At least one radio frequency receiver demodulates the resonance signals from the radio frequency coil and a reconstruction processor reconstructs the demodulated signals into an image representation. The radio frequency coil includes an electrically conductive outer loop. A first electrically conductive element extends between a first pair of symmetric, 180° opposite points on the loop. A second electrically conductive element extends between a second pair of symmetric, 180° opposite points on the loop. The second pair of 180° opposite points are substantially 90° offset from the first pair of 180° opposite points. In this manner, the resonance signals from the first and second conductive elements are substantially 90° out-of-phase in a quadrature relationship. The first and second electrically conductive elements are connected via electrical leads with the at least one receiver.

In accordance with a more limited aspect of the present invention, one or more like coils is partially overlapped to a point of mutual inductance to define a coil array.

In accordance with another aspect of the present application, a quadrature radio frequency coil assembly is provided for receiving radio frequency magnetic resonance signals emanating from dipoles in a magnetic field that extends parallel to a first direction. The radio frequency coil includes a first electrical conductor having a first radio frequency signal output defined therealong. A second electrical conductor has a second radio frequency output therealong. The first and second electrical conductors cross, but are not electrically connected, adjacent their mid-points. The first and second electrical conductors cross perpendicular to each other in a plane perpendicular to the first direction. A radio frequency conductor means interconnects ends of the first and second electrical conductors.

In accordance with a more limited aspect of the present invention, the radio frequency conductor means includes one of a square loop, a pair of square loops, or an interconnection that defines a pair of crossing Figure-8 coils.

In accordance with another aspect of the present invention, a radio frequency coil array is provided. First and second peripheral loops, which are conductive to induced magnetic resonance frequency currents are disposed in a partially overlapping relationship. A first pair of crossing members is connected with pairs of 180° out-of-phase points on the first peripheral loop, which pairs of out-of-phase points are 90° out-of-phase with each other at the induced magnetic resonance frequency. A second pair of crossing members are connected with a pair of 180° out-of-phase points with the second peripheral loop, which pairs of out-of-phase points are again 90° out-of-phase with each other.

One advantage of the present invention is that it provides quadrature detection over an extended region of the anatomy on vertical field systems.

Another advantage of the present invention is that it simultaneously receives in quadrature for improved signal-to-noise and reduced acquisition time.

Another advantage of the present invention is that it may be contoured to the anatomical area of interest.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
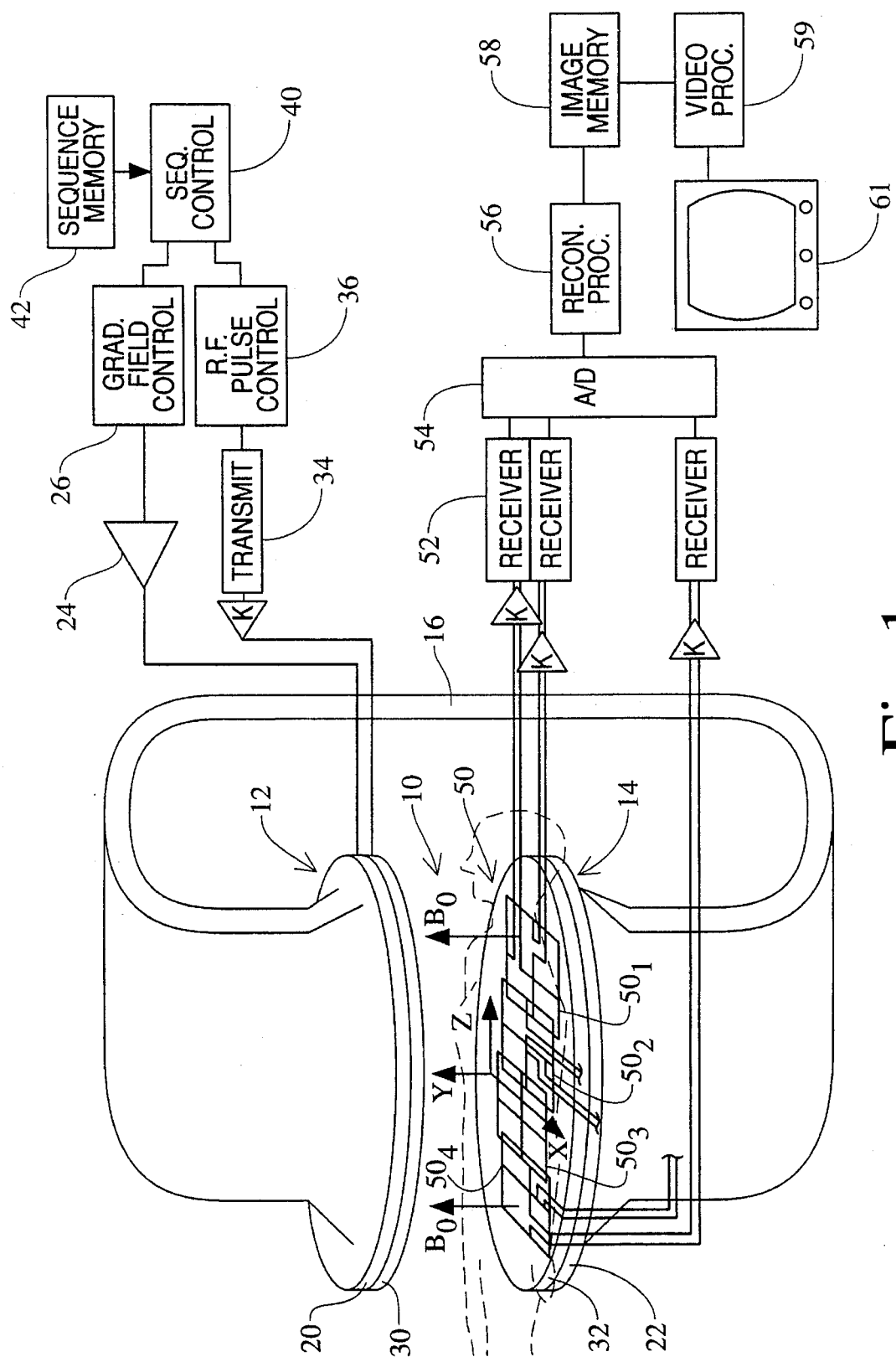
FIG. 1 is a diagrammatic illustration of a magnetic resonance system in accordance with the present invention.

With reference to FIG. 1, an imaging region 10 is defined between pole pieces 12, 14. The pole pieces are interconnected by a ferrous flux path 16, such as a C or U-shaped iron element. In a preferred embodiment, the iron element 16 is a permanent magnet which causes a vertical $B_0$ magnetic field between the pole faces across the imaging region. Alternately, electrical windings may be provided for inducing the magnetic flux in the ferrous flux path 16 and the $B_0$ field across the pole faces. Passive or active shims are disposed at the pole pieces or in the ferrous flux path adjacent the pole pieces to render the vertical $B_0$ field more linear across the imaging region 10.

For imaging, magnetic field gradient coils 20, 22 are disposed at the pole pieces 12, 14. In the preferred embodiment, the gradient coils are planar coil constructions which are connected by gradient amplifiers 24 to a gradient magnetic field controller 26. The gradient magnetic field controller, as is known in the art, causes current pulses which are applied to the gradient coils such that gradients in the uniform magnetic field are created along the longitudinal or z-axis, the vertical or y-axis, and the transverse or x-axis.

In order to excite magnetic resonance in dipoles of a subject disposed in the examination region 10, radio frequency coils 30, 32 are disposed between the gradient coils and the imaging region. A radio frequency transmitter 34, preferably a digital transmitter, causes the radio frequency coils to transmit radio frequency pulses requested by a radio frequency pulse controller 36 to be transmitted into the imaging region 10. A sequence controller 40, under operator control, retrieves an imaging sequence from a sequence memory 42. The sequence controller 40 provides the sequence information to the gradient controller 26 and the radio frequency pulse controller 36 such that radio frequency and gradient magnetic field pulses in accordance with the selected sequence are generated.

A radio frequency surface coil assembly 50 is disposed along a region of interest of the subject. Typically, the radio frequency coils 30, 32 are general purpose coils and are built-in. On the other hand, specialty surface coils are removable for greater flexibility. However, the surface coil 50 and the below-described alternate embodiments can be the only radio frequency coils in the system. In the embodiment of FIG. 1, the surface coil assembly 50 is an elongated spine coil that is disposed on a patient supporting surface immediately below the spinal column of a patient resting on the patient supporting surface. The surface coil assembly 50 with radio frequency receivers 52 demodulates the radio frequency resonance signals received by the built-in and/or removable radio frequency coils. As is explained in greater detail below in conjunction with FIGS. 3 and 4, the surface coil assembly 50 is an array of coils, each connected with one or more receivers 52. Signals from the receivers are digitized with an array of analog-to-digital converters 54 and processed by a reconstruction processor 56 into volumetric image representations which are stored in a volumetric image memory 58. A video processor 60, under operator control, withdraws selected image data from the volume memory and formats it into appropriate format for display on a human-readable display 62, such as a video monitor, active-matrix monitor, liquid crystal display, or the like.

Figure 2:
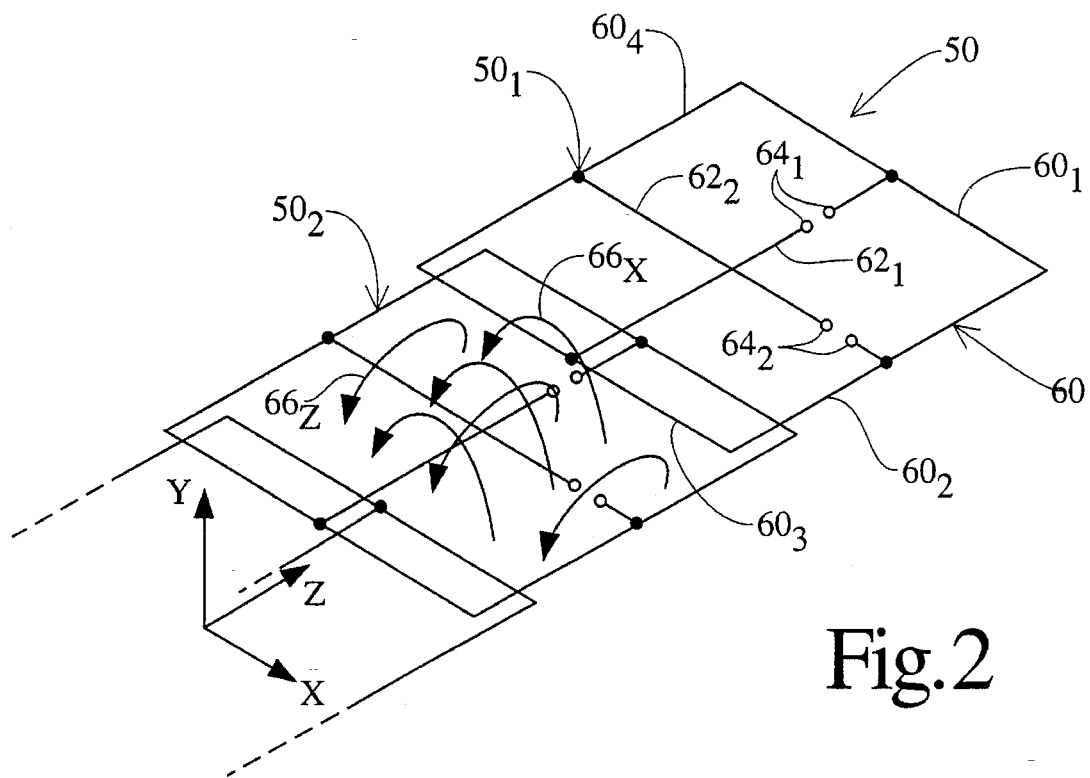
FIG. 2 is an enlarged view of the coil assembly of FIG. 1.

With reference to FIG. 2, the coil array 50 has a plurality of window pane coils $50_1$, $50_2$, etc. of like construction. Each of the window pane coils has two modes, one in the x-direction and one in the z-direction. More specifically, each window pane coil includes a peripheral loop 60 which, in the illustrated embodiment, has four legs or segments $60_1$, $60_2$, $60_3$, and $60_4$ of equal length which are disposed in an orthogonal pattern to define a square. A first cross-member $62_1$ is connected to oppositely disposed, 180° opposite points on the peripheral loop, specifically to the center of oppositely disposed peripheral elements $60_1$ and $60_3$. Signal take-off points $64_1$ are connected by leads from the first cross-member to the receivers 52. A second cross-member $62_2$ is connected to 180° opposite connection points on the outer loop that are 90° offset with respect to the first cross-member connection points, particularly to the central point of opposite legs $60_2$ and $60_4$. The two cross-members $62_1$ and $62_2$ cross perpendicular to each other but are not connected to each other. A second pair of take-off points $64_2$ on the second cross-member $62_2$ are connected by leads with the receivers 52. Each of the window pane coils $52_1$, $52_2$, etc. has analogous coil take-offs. The coil defined by the cross-member $62_1$ and the loop coil 60 receives radio frequency signals with a polarity $66_x$. By distinction, the coil defined by the loop coil 60 and the cross-member $62_2$ is sensitive to radio frequency signal components $66_z$, which extend in the z-direction. Capacitors are added as necessary to tune the coils such that the first pair of connection points are at a virtual ground with respect to the second take-off points and the second pair of connection points is at a virtual ground with respect to the first take-off points.

Figure 3:
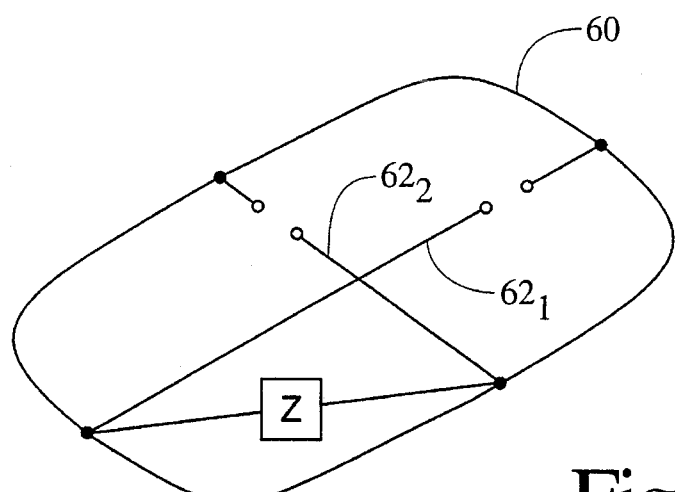
FIG. 3 illustrates a technique for trueing the orthogonality of the components of a single coil.

For a two-coil construction, there are thus four modes—two x-modes and two z-modes. The x-modes and z-modes within each coil are orthogonal to each other and have minimum mutual inductance due to the symmetry. Alternately, as shown in FIG. 3, a reactive element can be connected between cross-members to adjust the orthogonality of the modes, particularly when the above-discussed symmetry is lacking. Analogously, the x-mode in one coil and the z-mode in the other coil are orthogonal and have minimal mutual inductance due to the symmetry. The coils are overlapped such that the x-modes between two adjacent coils have a minimum mutual inductance due to spatial position. Preferably, the z-modes of the two coils also have minimum mutual inductance at the overlap.

Figure 4:
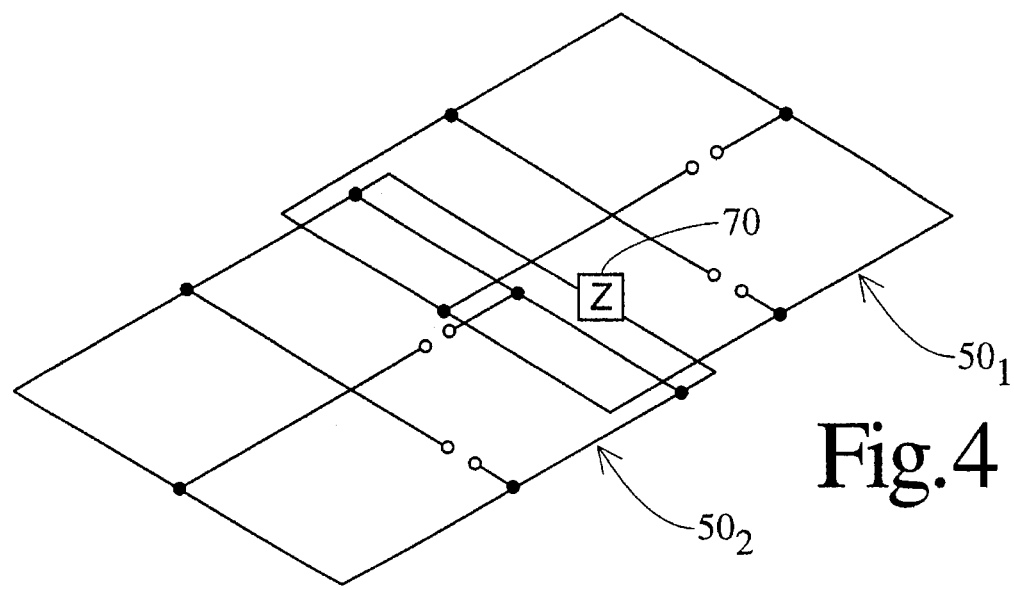
FIG. 4 illustrates a technique for adjusting the mutual inductance of two or more coils.
Figure 5:
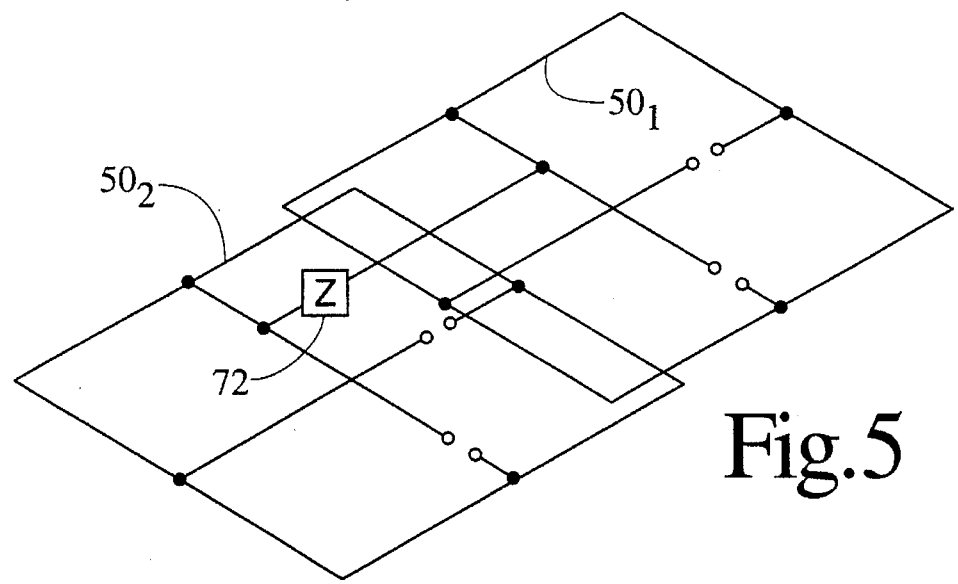
FIG. 5 illustrates another technique for adjusting the coils to minimize their mutual inductance.
Figure 6:
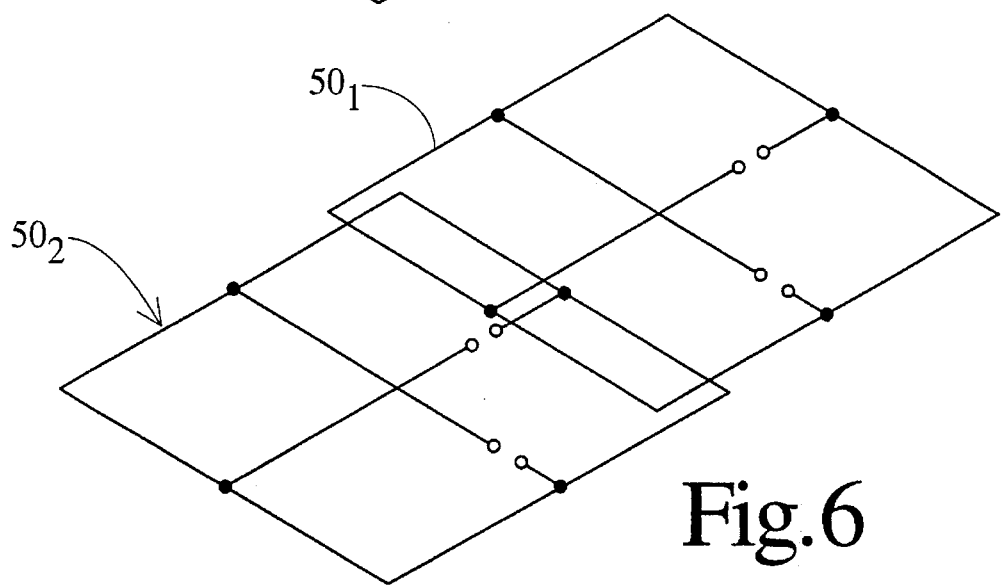
FIG. 6 illustrates yet another technique for minimizing the mutual inductance of the coils.

With reference to FIG. 4, the two coils are overlapped until the x-modes have a minimum mutual inductance. If the z-modes do not have a minimum mutual inductance at this point, a reactive element 70 is added for changing the current distribution of the z-mode of one or both coils until minimum mutual inductance is achieved. Alternately, as illustrated in FIG. 5, a reactive element 72 can be placed between the two coils to feed current between the coils to achieve minimum mutual inductance. The reactance 72 can be between the z-mode cross-members to minimize the mutual inductance between the z-modes. As yet another alternative, as illustrated in FIG. 6, the dimension of one or both of the coils in the z-direction can be extended or contracted to achieve mutual minimum inductance by changing geometry.

Figure 7:
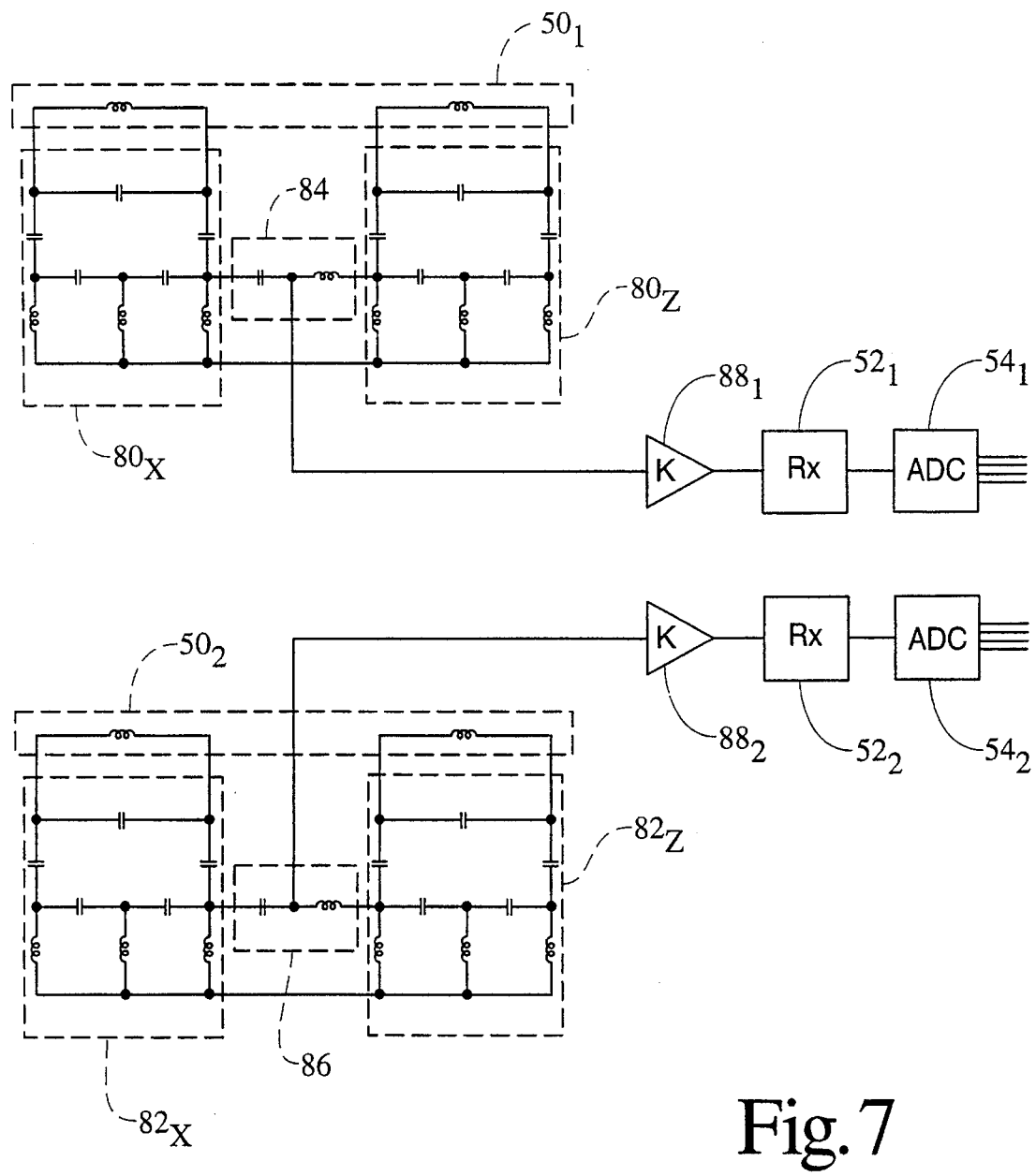
FIG. 7 is a schematic representation of the coil array of FIG. 2 in which the quadrature components are combined at the coil.

With reference to FIG. 7, the x and z-orthogonal coil leads from coil $50_1$, are connected independently with a pair of matching circuits $80_x$ and $80_z$. Analogously, the x and z-mode coils of the window pane coil $50_2$ are connected with matching circuits $82_x$ and $82_z$. Some or all of the capacitors or other reactive elements of the circuits 80, 82 can be incorporated into the coil 50. The x and z-components of the window pane coil $50_1$ are 90° phase-shifted and combined by a phase-shifter and combiner circuit 84. Analogously, the x and z-components of the window pane coil $50_2$ are 90° phase-shifted and combined by a phase-shifter and combiner 86. The combined, unitary output from each of the coils $50_1$, $50_2$, etc. are connected with amplifiers $88_1$, $88_2$. Preferably, the amplifiers are mounted at the coil assembly. The plurality of receivers 52 includes a receiver $52_1$ for demodulating the combined signal from coil $50_1$ and a second receiver $52_2$ for demodulating the combined output signal from coil $50_2$. The analog-to-digital converter array 54 includes an analog-to-digital converter $54_1$ for digitizing the output of receiver $52_1$ and an analog-to-digital converter $54_2$ for digitizing the output of the radio frequency receiver $52_2$.

Figure 8:
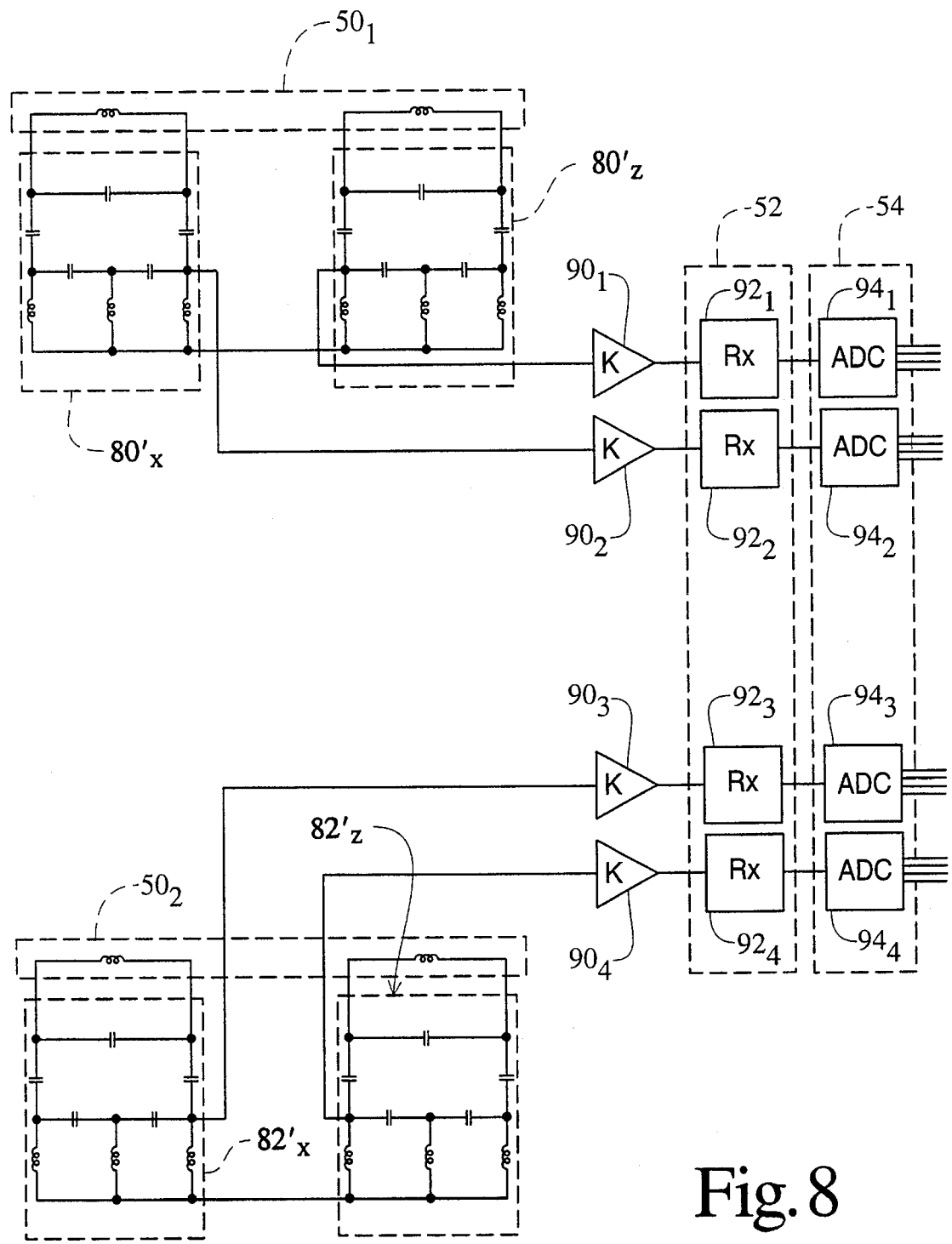
FIG. 8 is a schematic representation of the coil array of FIG. 2 in which the signals from each coil are processed individually.

With reference to FIG. 8, the output of each component of the coils can be demodulated individually. More specifically, the x and z-components of coil $50_1$ are again conveyed to matching circuits $80_x'$ and $80_z'$ while the x and z-components of coil $50_2$ are conveyed to matching circuits $82_x'$ and $82_z'$. The outputs of the matching circuits are conveyed to individual preamplifiers $90_1$, $90_2$, $90_3$, and $90_4$. The array of receivers 52 includes individual receivers $92_1$, $92_2$, $92_3$, and $92_4$ for demodulating each of the x and z-components. Analogously, the analog-to-digital converter array 54 includes individual analog-to-digital converters $94_1$, $94_2$, $94_3$, $94_4$ for digitizing each of the components. These signals may be combined in digital form analogous to the combiner of FIG. 7 or used in other types of processing as are known in the art. As yet another alternative, the resonance signals can be digitized on the surface coil assembly and demodulated by a digital receiver.

Figure 9:
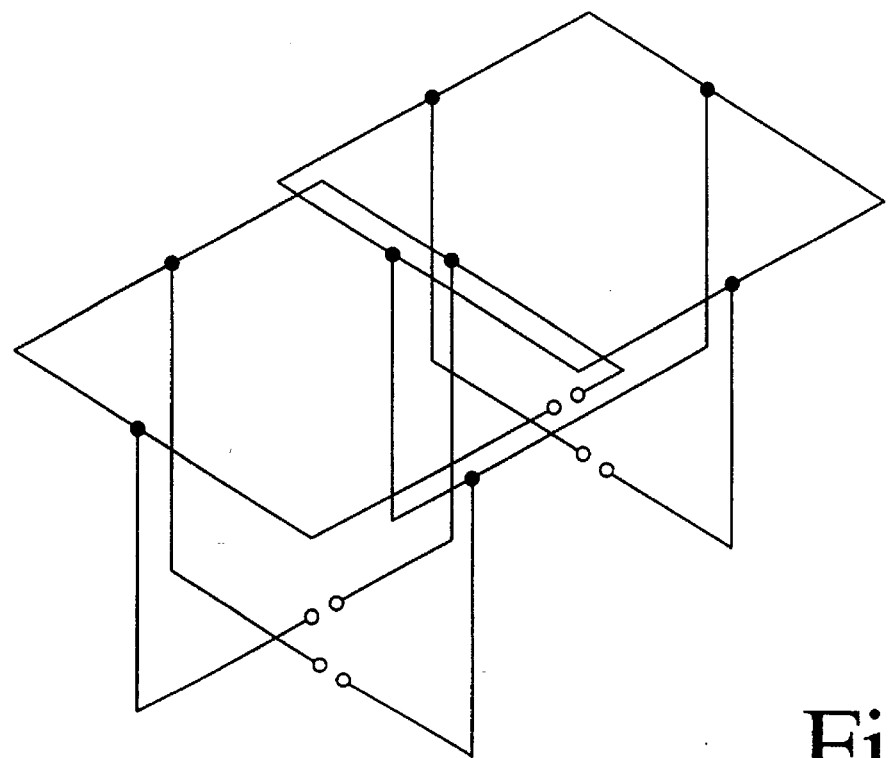
FIG. 9 illustrates an alternate embodiment in which the coils are non-planar to accommodate patient anatomy.
Figure 10:
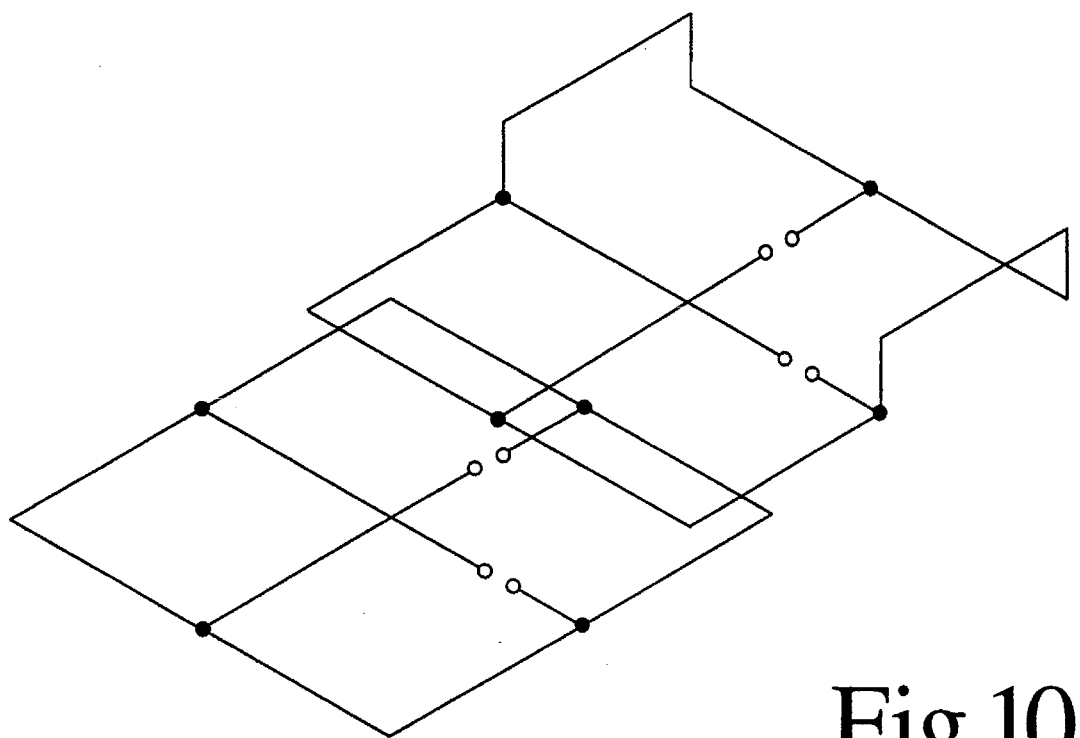
FIG. 10 illustrates another alternate embodiment in which the coils are non-planar to accommodate patient anatomy.

With reference to FIG. 9, the window pane coils may be non-planar to conform with portions of the patient's anatomy. For example, the cross-members may extend out of the plane, symmetrically, such as to follow the contours of the patient's breasts for breast imaging. In the embodiment of FIG. 10, portions of the exterior loop coil are raised out of the plane to provide better coverage of the patient's neck, for example. As yet another alternative, the coils may be disposed along an arcuate curve.

Figure 11:
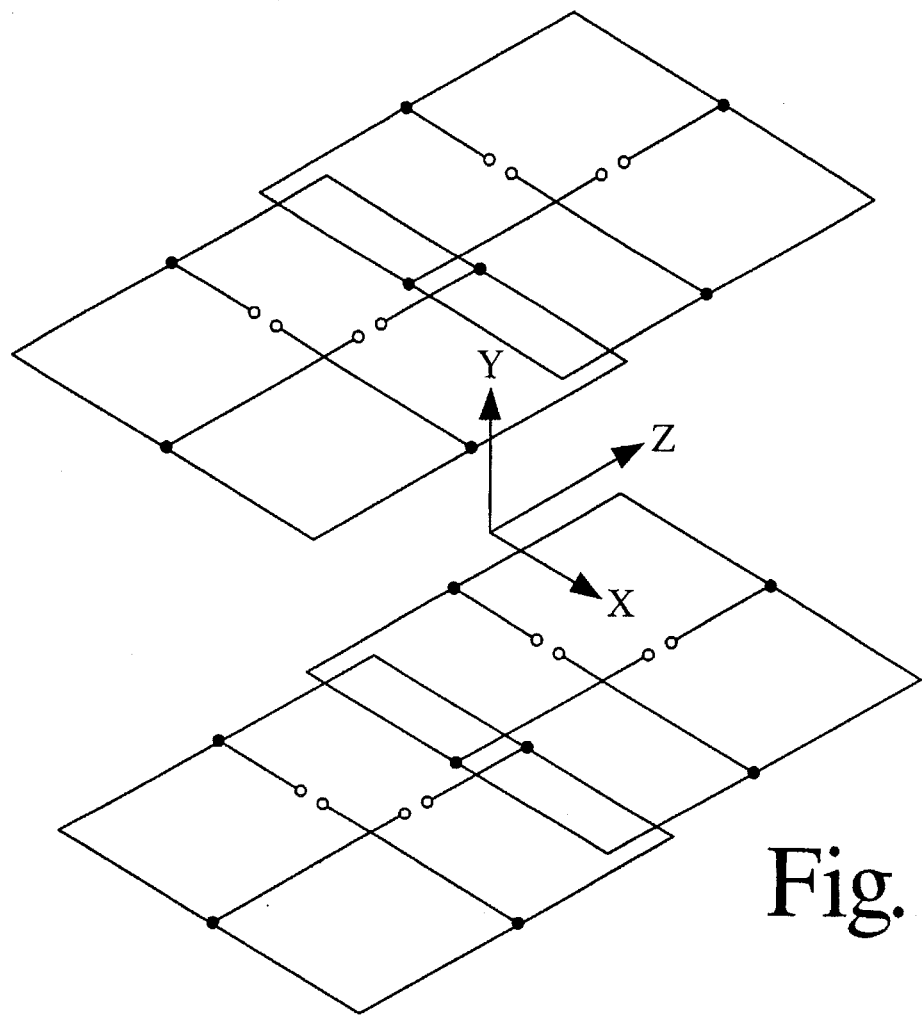
FIG. 11 is another alternate embodiment in which two parallel arrays are provided on opposite sides of the patient for volume imaging.

With reference to FIG. 11, a pair of arrays can be positioned on opposite surfaces of the patient to surround the imaging volume more completely. The FIG. 11 embodiment is well-adapted to be built into the pole pieces as the standard whole volume radio frequency coils.

Figure 12:
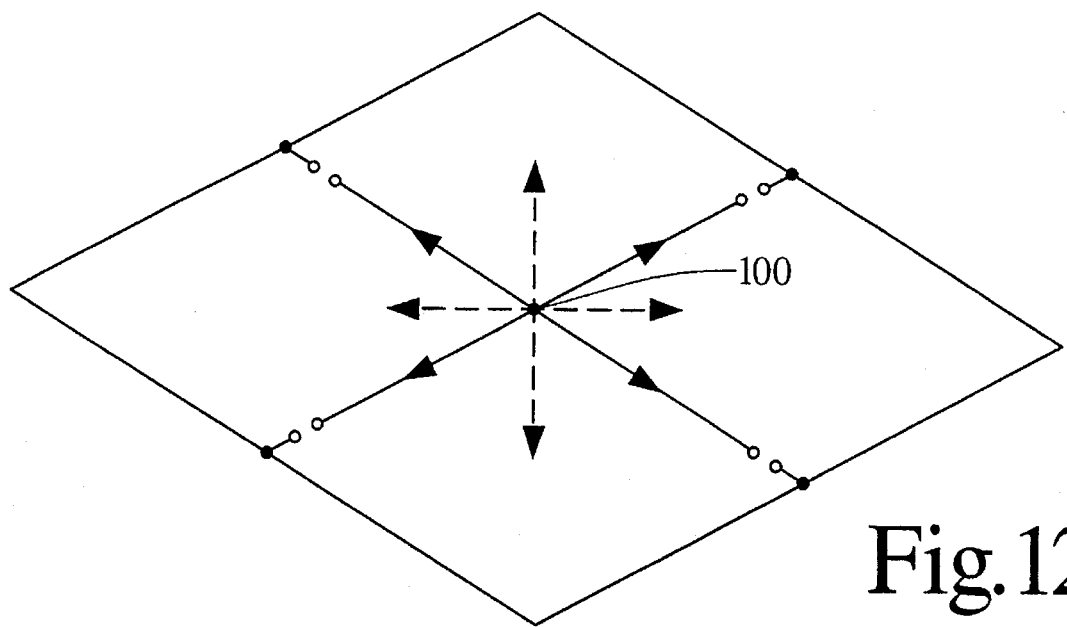
FIG. 12 illustrates another alternate embodiment of the present invention with four modes.

With reference to FIG. 12, the cross-members of the window pane coil can be connected at a central point 100. This provides a coil with two additional modes. In particular, when the window pane coil is symmetric, the two extra modes are at 45° relative to the x and z-modes and at a higher frequency. This enables the coil to be doubly-tuned for multi-channel spectroscopy imaging. As indicated above, although the window pane coil is preferably symmetric, it need not be. Reactive elements may be provided between the modes to adjust their relative orthogonality.

Figure 13:
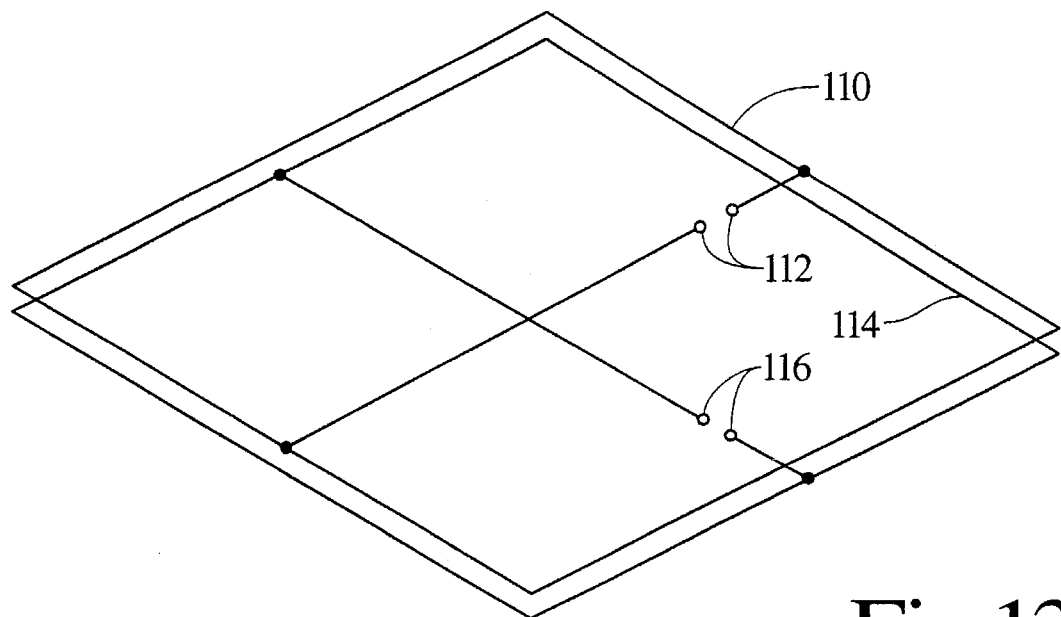
FIG. 13 illustrates another alternate embodiment with a pair of double-D coils; and, FIG. 14 illustrates another alternate embodiment with a pair of orthogonal Figure-8 coils.
Figure 14:
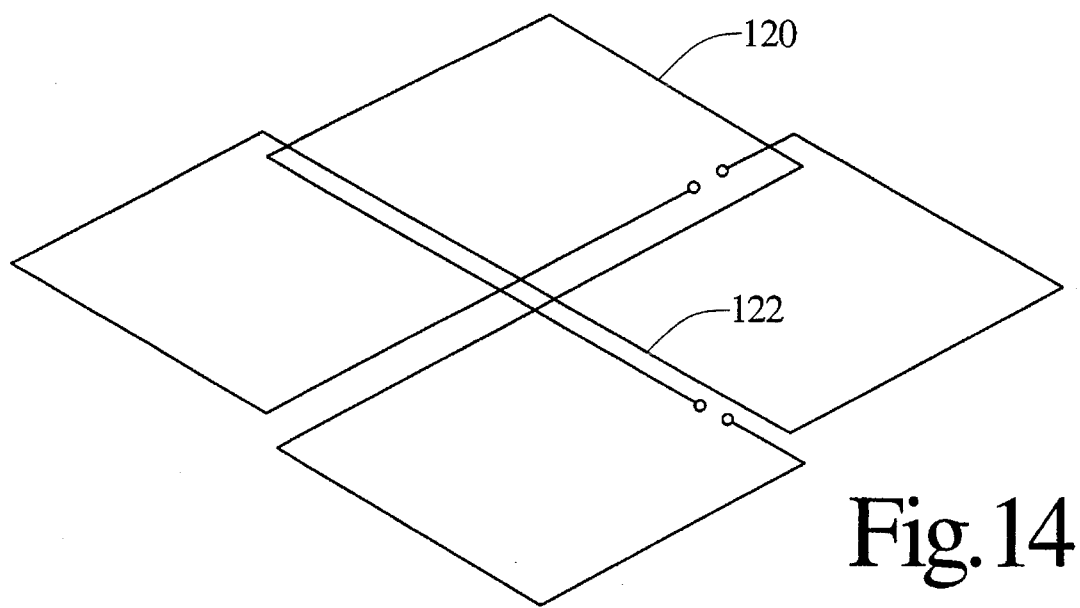

As illustrated in FIG. 13, each of the window pane coils $50_1$, $50_2$, etc. may be built from a pair of analogous double-D or butterfly coils rotated 90° relative to each other. In the FIG. 13 embodiment, coil 50 includes a first double-D coil 110 having take-off points 112 and a second double-D coil 114 having take-off points 116. These assemblies can again be overlapped to form arrays and can have added reactive elements to adjust orthogonality. As illustrated in FIG. 14, the window pane coils can be approximated by a pair of Figure-8 or double-diamond coils 120, 122. The coils again have substantially linear segments that cross perpendicular to each other, without connecting. The coils can again be overlapped in arrays, preferably with its outer loop portion square or rectangular.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging system which includes a pair of generally horizontal magnet pole pieces between which a vertical, temporally constant $B_0$ magnetic field is defined, a generally C-shaped ferrous flux path connecting the pole pieces, gradient magnetic field coils disposed adjacent the pole pieces for causing gradient magnetic fields across the temporally constant $B_0$ magnetic field, an RF transmitter for exciting resonance in selected dipoles in between the pole faces such that the dipoles generate resonance signals at a characteristic resonance frequency, a radio frequency coil array for receiving resonance signals from the resonating dipoles, at least one radio frequency receiver for demodulating the resonance signals from the radio frequency coil array, and a reconstruction processor for reconstructing the demodulated radio frequency signals into an image representation, the radio frequency coil array comprising:

a first radio frequency coil having a first field of view, the first radio frequency coil including:
a first electrically conductive outer loop;
a first electrically conductive connecting element extending between a first pair of symmetric 180° opposite points of the first loop;
a second electrically conductive element connected between a second pair of symmetric 180° opposite points on the first loop, which second pair of 180° opposite points on the first loop are substantially 90° offset from the first pair of 180° opposite points, such that the resonance signals from the first and second conductive elements are substantially 90° out-of-phase in a quadrature relationship, the first and second electrically conductive elements being connected via electrical leads with the receiver;
a second radio frequency coil having a second field of view different from and contiguous to the first field of view, the second radio frequency coil including:
a second electrically conductive loop that partially overlaps the first electrically conductive loop;
a third electrically conductive connecting element extending between a third pair of symmetric 180° opposite points of the second loop;
a fourth electrical connecting member connected between a fourth pair of 180° opposite points on the loop, which fourth 180° opposite points on the loop are substantially 90° offset from the third pair of 180° opposite points.

2. In the magnetic resonance imaging system as set forth in claim 1, the radio frequency coil array further comprising: the first outer loop and the first and second connecting elements all lying substantially in a common plane.

3. In the magnetic resonance imaging system as set forth in claim 1, the radio frequency coil array further comprising:
the first outer loop being square with the first 180° opposite points being disposed at mid-points of first opposite sides of the square and the second 180° opposite points being disposed at mid-points of second opposite sides of the square.

4. In the magnetic resonance imaging system as set forth in claim 3, the radio frequency coil array further comprising:
connecting the mid-points of the first and second connecting elements to define four symmetric interconnecting segments, each of the interconnecting segments being connected with the receiver such that the coil supports four modes.

5. In the magnetic resonance imaging system as set forth in claim 1 wherein the first radio frequency coil has a first mode and a second mode and the second radio frequency coil has a first mode and a second mode, the first and second electrically conductive loops being overlapped such that the first and second radio frequency coil first modes have a minimum mutual inductance and further including:
an adjustable reactance for minimizing mutual inductance between first and second radio frequency coil second modes.

6. A quadrature radio frequency coil array for receiving radio frequency magnetic resonance signals emanating from dipoles in an elongated region of interest in a magnetic field that extends parallel to a first direction, the radio frequency coil array comprising:

(a) a first quadrature radio frequency coil having first and second orthogonal modes, the first quadrature radio frequency coil including:
a first electrical conductor having a first radio frequency signal output defined therealong;
a second electrical conductor having a second radio frequency output therealong, the first and second electrical conductors crossing but not electrically connected adjacent mid-points thereof, the first and second electrical conductors crossing perpendicular to each other in a plane perpendicular to the first direction;
a radio frequency conductor interconnecting ends of the first and second electrical conductors;
(b) a second quadrature radio frequency coil having first and second orthogonal modes, the second quadrature coil being disposed in a partial overlapping relationship with the first radio frequency coil such that mutual inductance of the first and second quadrature coil first modes is minimized; and,
(c) a reactance for adjusting and minimizing mutual inductance between the first and second quadrature coil second modes.

7. The radio frequency coil array as set forth in claim 6 wherein the radio frequency conductor includes:
a first peripheral conductor having a mid-point electrically connected with a first end of the first conductor;
a second peripheral conductor connected at a mid-point to a second end of the first electrical conductor;
a third peripheral conductor being connected at its ends with ends of the first and second peripheral conductors and being connected at a mid-point with a first end of the second electrical conductor; and,
a fourth peripheral conductor being connected at its ends with ends of the first and second peripheral conductors and being connected at a mid-point with a second end of the second electrical conductor.

8. The radio frequency coil array as set forth in claim 7 wherein the first, second, third, and fourth peripheral electrical conductors are linear with the first and second electrical conductors being disposed parallel to each other and the third and fourth peripheral electrical conductors being disposed parallel to each other.

9. The radio frequency coil array as set forth in claim 6 wherein the second quadrature radio frequency coil includes:

a first electrical conductor having a first mode radio frequency output defined therealong;

a second electrical conductor having a second mode radio frequency output therealong, the first and second electrical conductors crossing but not electrically connected adjacent mid-points thereof, the first and second electrical conductors crossing perpendicular to each other in a plane perpendicular to the first direction;

a radio frequency conductor interconnecting ends of the second quadrature radio frequency coil first and second electrical conductors, the radio frequency conductors of the first and second quadrature radio frequency coils being partially overlapped.

10. The radio frequency coil array as set forth in claim 9 wherein the first coil first electrical conductor is parallel to the second coil first electrical conductor and the first coil second electrical conductor is parallel to the second coil second electrical conductor.

11. The radio frequency coil array as set forth in claim 10 wherein the first coil radio frequency conductor and the second coil radio frequency conductor include first and second partially overlapping rectangles.

12. The radio frequency coil array as set forth in claim 11 wherein:

the first coil first electrical conductor is connected with mid-points of first opposite sides of the first rectangle and the first coil second electrical conductor is connected with second opposite sides of the first rectangle;

the second coil first electrical conductor is connected with mid-points of first opposite sides of the second rectangle and the second coil second electrical conductor is connected with second opposite sides of the second rectangle.

13. The radio frequency coil array as set forth in claim 6 wherein the radio frequency conductor includes:

a first electrically conductive loop connected with ends of the first electrical conductor at points 180° out-of-phase around the first conductive loop; and, a second electrically conductive loop connected with ends of the second electrical conductor at points 180° out-of-phase around the second conductive loop.

14. A quadrature radio frequency coil assembly for receiving radio frequency magnetic resonance signals emanating from dipoles in a magnetic field that extends parallel to a first direction, the radio frequency coil assembly comprising:

a first electrical conductor having a first radio frequency signal output defined therealong;

a second electrical conductor having a second radio frequency output therealong, the first and second electrical conductors crossing but not electrically connected adjacent mid-points thereof, the first and second electrical conductors crossing perpendicular to each other in a plane perpendicular to the first direction;

a first conductor that extends clockwise from a first end of the first conductor, parallel with the second conductor and counterclockwise to a second end of the first conductor to define a Figure-8 shaped coil; and, a second conductor that extends clockwise from a first end of the second conductor, parallel with the first conductor and counterclockwise to a second end of the second conductor to define another Figure-8 shaped coil.

15. A radio frequency coil array for receiving resonance signals from an extended region of interest comprising:

a first peripheral loop that is conductive to magnetic resonance frequency currents induced by dipoles resonating with a magnetic resonance frequency in a first portion of the region of interest;

a second peripheral loop that is conductive to magnetic resonance frequency currents induced by dipoles resonating with a magnetic resonance frequency in a second portion of the region of interest, the second peripheral loop partially overlapping the first peripheral loop such that the first and second portions of the region of interest only partially overlap;

a first pair of crossing members that are conductive to the magnetic resonance frequency currents in the first peripheral loop, the first pair of crossing members being connected with pairs of 180° out-of-phase points of the first peripheral loop which pairs of out-of-phase points are 90° out-of-phase with each other, at the induced magnetic resonance frequency; and, a second pair of crossing members that are conductive to the induced magnetic resonance frequency currents in the second peripheral loop, the second pair of crossing members being connected with pairs of 180° out-of-phase points of the second peripheral loop which pairs of out-of-phase points are 90° out-of-phase with each other, at the induced magnetic resonance frequency.

16. The radio frequency coil array as set forth in claim 15, wherein the first and second peripheral loops include first and second squares of like dimension and the first and second pairs of crossing members are connected with mid-points of sides of the first and second squares, respectively.

17. A radio frequency coil array comprising:

a first peripheral loop that is conductive to induced magnetic resonance frequency currents;

a second peripheral loop that is conductive to induced magnetic resonance frequency currents, the second peripheral loop partially overlapping the first peripheral loop;

a first pair of crossing members that are conductive to induced magnetic resonance frequency currents, the first pair of crossing members being connected with pairs of 180° out-of-phase points of the first peripheral loop which pairs of out-of-phase points are 90° out-of-phase with each other, at the induced magnetic resonance frequency, such that the induced magnetic resonance frequency currents in each of the first pair of crossing members have first and second quadrature modes, respectively;

a second pair of crossing members that are conductive to induced magnetic resonance frequency currents, the second pair of crossing members being connected with pairs of 180° out-of-phase points of the second peripheral loop which pairs of out-of-phase points are 90° out-of-phase with each other, at the induced magnetic resonance frequency such that the induced magnetic resonance frequency currents in each of the second pair of crossing members have first and second quadrature modes, respectively; and, a reactive element connected with at least one of the crossing members and peripheral loops for adjusting relative mutual inductance between the first quadrature modes.

18. The radio frequency coil array as set forth in claim 17 further including:

a first pair of radio frequency pick-up connections associated with each element of the first pair of crossing elements such that the first pair of radio frequency pick-ups receive quadrature resonance frequency signals of the first and second modes;

a second pair of radio frequency pick-up connections associated with each element of the second pair of crossing elements such that the second pair of radio frequency pick-ups receive quadrature resonance frequency signals of the first and second modes.

19. The radio frequency coil array as set forth in claim 18 wherein the elements of the first pair of crossing elements are orthogonal to each other and parallel to the elements of the second pair of crossing elements.

* * * * *